(12) United States Patent
Yang et al.

(10) Patent No.: US 10,672,807 B1
(45) Date of Patent: Jun. 2, 2020

(54) PHOTO DETECTORS

(71) Applicant: QUALCOMM Incorporated, San Diego, CA (US)

(72) Inventors: Bin Yang, San Diego, CA (US); Xia Li, San Diego, CA (US); Gengming Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/231,115

(22) Filed: Dec. 21, 2018

(51) Int. Cl.
| | |
|---|---|
| H01L 27/144 | (2006.01) |
| H01L 31/0232 | (2014.01) |
| H01L 31/0296 | (2006.01) |
| H01L 31/0304 | (2006.01) |
| H01L 31/103 | (2006.01) |
| H01L 31/18 | (2006.01) |
| H01L 31/0216 | (2014.01) |
| H01L 31/028 | (2006.01) |

(52) U.S. Cl.
CPC ........ *H01L 27/1443* (2013.01); *H01L 31/028* (2013.01); *H01L 31/0296* (2013.01); *H01L 31/02162* (2013.01); *H01L 31/02327* (2013.01); *H01L 31/02966* (2013.01); *H01L 31/03044* (2013.01); *H01L 31/03046* (2013.01); *H01L 31/03048* (2013.01); *H01L 31/103* (2013.01); *H01L 31/1032* (2013.01); *H01L 31/1035* (2013.01); *H01L 31/1804* (2013.01); *H01L 31/1828* (2013.01); *H01L 31/1832* (2013.01); *H01L 31/1844* (2013.01); *H01L 31/1848* (2013.01); *H01L 31/1856* (2013.01)

(58) Field of Classification Search
CPC .................................................. H01L 27/1443
USPC .......................................................... 257/440
See application file for complete search history.

(56) References Cited

U.S. PATENT DOCUMENTS

| | | | | |
|---|---|---|---|---|
| 6,229,191 B1* | 5/2001 | Cao | ................... | H01L 27/14632 257/226 |
| 2003/0197855 A1* | 10/2003 | Jung | .................... | A61B 5/0088 356/73 |
| 2007/0012863 A1* | 1/2007 | Han | .................. | H01L 27/14601 250/208.1 |
| 2008/0027317 A1* | 1/2008 | Wood | .................... | A61B 5/0059 600/427 |
| 2016/0142660 A1* | 5/2016 | Shen | ...................... | H04N 5/361 348/162 |

\* cited by examiner

*Primary Examiner* — Jami Valentine Miller

(57) ABSTRACT

A photo detector comprises a first photo diode configured to capture visible light, a second photo diode configured to capture one of infrared light or ultraviolet light, and an isolation region between the first photo diode and the second photo diode. The photo detector is capable of capturing infrared light and ultraviolet light in addition to visible light.

28 Claims, 6 Drawing Sheets

PHOTO DETECTORS

BACKGROUND

Field

Certain aspects of the present disclosure generally relate to photo detectors, and more particularly, to photo detectors capable of capturing infrared light and ultraviolet light in addition to visible light.

Background

Cameras are essential components for smartphones. There are generally at least one to two cameras on each smartphone for taking high quality pictures. Most conventional cameras can only capture visible light (i.e., wavelength between 400 nanometer (nm) and 700 nm) and are blind to infrared light (i.e., wavelength between 700 nm and 1000 nm) and ultraviolet light (i.e., wavelength between 10 nm and 400 nm), which may negatively affect quality of pictures in certain situations. It is difficult for conventional cameras that can only capture visible light to take high quality pictures at night when intensity of visible light is low. Meanwhile, a camera that can capture infrared light would be capable of taking high quality pictures at night. Thus, it is desirable to develop a camera that can capture a broad spectrum of light.

Cameras generally use photo detectors to capture images. When light with different wavelengths is captured, photo detectors based on different materials are used. For example, visible light photo detector usually employs Silicon (Si) as photo detector material. Infrared light photo detector usually employs III-V semiconductor materials, such as Indium Gallium Arsenide (InGaAs), or II-VI semiconductor materials, such as Mercury Cadmium Telluride (HgCdTe), as photo detector material. Ultraviolet light photo detector usually employs III-V semiconductor materials, such as Gallium Nitride (GaN) and Aluminum Nitride (AlN), or II-VI semiconductor materials, such as Zinc Oxide (ZnO), as photo detector material. Because the different materials used for different photo detectors, photo detectors for light with different wavelengths are usually fabricated as separate devices. Thus, it is not possible to capture visible light, infrared light, and ultraviolet light in a same picture using a single photo detector. For smartphones capable of taking pictures using infrared light or ultraviolet light, additional cameras with different photo detectors have to be installed which would occupy additional space on smartphones. Thus, there is a need for a photo detector that is capable of capturing infrared light and ultraviolet light in addition to visible light.

SUMMARY

Certain aspects of the present disclosure provide a photo detector. The photo detector may include a first photo diode configured to capture visible light. The photo detector may also include a second photo diode configured to capture one of infrared light or ultraviolet light. The photo detector may further include a first isolation region between the first photo diode and the second photo diode.

Certain aspects of the present disclosure provide a method for fabricating a photo detector. The method may include forming a plurality of layers on a substrate. The method may also include forming a first photo diode for capturing visible light on the substrate. The method may further include forming a second photo diode for capturing one of infrared light or ultraviolet light on the substrate, wherein the first photo diode is separated from the second photo diode by a first isolation region.

This summary has outlined the features and embodiments of the present disclosure so that the following detailed description may be better understood. Additional features and embodiments of the present disclosure will be described below. It should be appreciated by those skilled in the art that this disclosure may be readily utilized as a basis for modifying or designing other equivalent structures for carrying out the same purposes of the present disclosure. It should also be realized by those skilled in the art that such equivalent constructions do not depart from the teachings of the present disclosure as set forth in the appended claims. The features, which are believed to be characteristic of the present disclosure, both as to its organization and method of operation, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
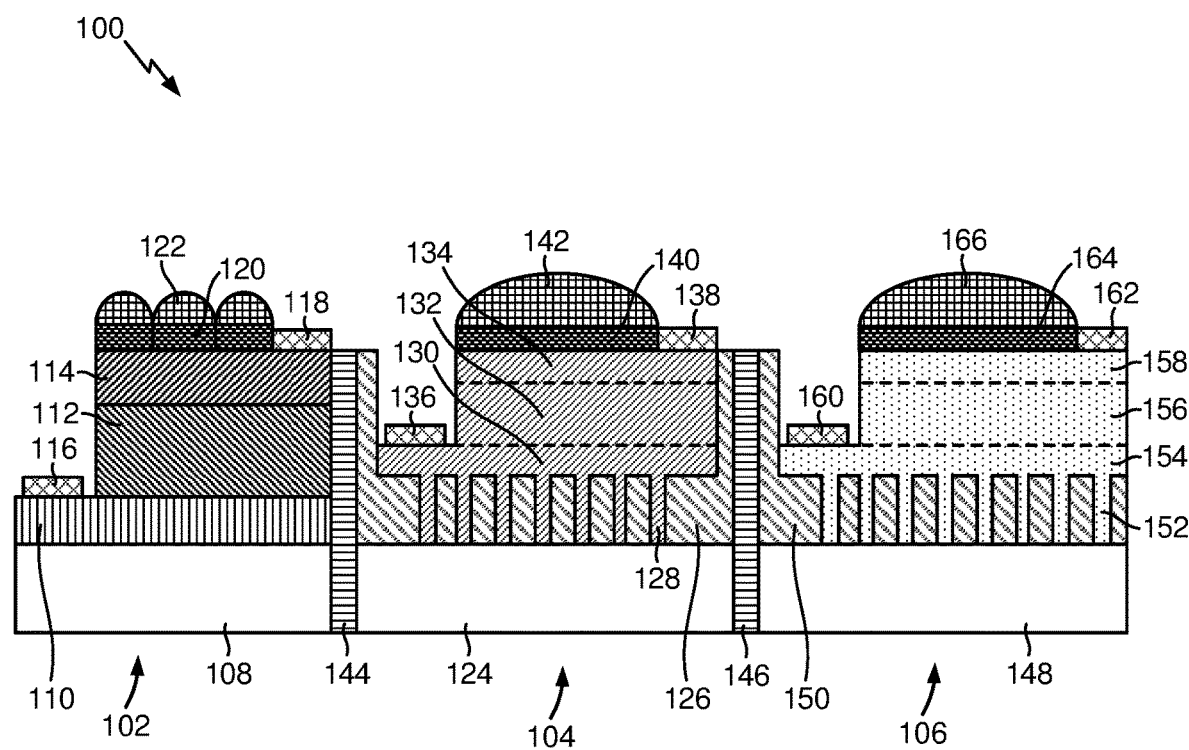
FIG. 1 illustrates an exemplary photo detector capable of capturing infrared light and ultraviolet light in addition to visible light in accordance with certain aspects of the present disclosure.

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The detailed description set forth below, in connection with the appended drawings, is intended as a description of various aspects and is not intended to represent the only aspect in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

FIG. 1 illustrates an exemplary photo detector capable of capturing infrared light and ultraviolet light in addition to visible light in accordance with certain aspects of the present disclosure. A photo detector 100 is shown in FIG. 1. The photo detector 100 comprises a first region 102 for capturing visible light, a second region 104 for capturing infrared light, and a third region 106 for capturing ultraviolet light. The first region 102 for capturing visible light comprises a first substrate 108, a first doped region 110 on the first substrate 108, a first undoped region 112 on the first doped region 110, and a second doped region 114 on the first undoped region 112. As an example, the first substrate 108 may comprise Silicon (Si) or other substrate materials, such as sapphire. The first doped region 110 may comprise P+ doped Si. The first undoped region 112 may comprise undoped Si. The second doped region 114 may comprise N+ doped Si. The first doped region 110, the first undoped region 112, and the second doped region 114 form a first photo diode for capturing visible light. The first region 102 also comprises a first contact 116 on the first doped region 110 and a second contact 118 on the second doped region 114. As an example, the first contact 116 may comprise Titanium (Ti)/Nickel (Ni)/Platinum (Pt) and the second contact 118 may comprise Ti/Ni/Pt. The first contact 116 forms ohmic contact with the first doped region 110 and the second contact 118 forms ohmic contact with the second doped region 114. The first region 102 further comprises a first color filter layer 120 and first on chip lenses 122. As an example, the first color filter layer 120 may comprise color filters for red, blue, and green light, respectively. The first on chip lenses 122 may comprise lenses for red, blue, and green light, respectively.

With continuing reference to FIG. 1, the second region 104 for capturing infrared light comprises a second substrate 124, a first hard mask layer 126 comprising a plurality of trenches on the second substrate 124, a first trench fill material 128 in the plurality of trenches of the first hard mask layer 126, a third doped region 130 on the first hard mask layer 126, a second undoped region 132 on the third doped region 130, and a fourth doped region 134 on the second undoped region 132. As an example, the second substrate 124 may comprise Si or other substrate materials, such as sapphire. The first hard mask layer 126 may comprise Silicon Nitride (SiN) or Hafnium Oxide (HfO$_2$). The first trench fill material 128 may comprise undoped Indium Gallium Arsenide (InGaAs) or Mercury Cadmium Telluride (HgCdTe). The third doped region 130 may comprise P+ doped InGaAs or P+ doped HgCdTe. The second undoped region 132 may comprise undoped InGaAs or undoped HgCdTe. The fourth doped region 134 may comprise N+ doped InGaAs or N+ doped HgCdTe. The third doped region 130, the second undoped region 132, and the fourth doped region 134 form a second photo diode for capturing infrared light. The second region 104 also comprises a third contact 136 on the third doped region 130 and a fourth contact 138 on the fourth doped region 134. As an example, the third contact 136 may comprise Ti/Pt and the fourth contact 138 may comprise Ti/Pt or Gold (Au)/Germanium (Ge). The third contact 136 forms ohmic contact with the third doped region 130 and the fourth contact 138 forms ohmic contact with the fourth doped region 134. The second region 104 further comprises a second color filter layer 140 and second on chip lenses 142. As an example, the second color filter layer 140 may comprise color filters for infrared light. The second on chip lenses 142 may comprise lenses for infrared light. The first region 102 and the second region 104 are separated by a first isolation region 144. As an example, the first isolation region 144 may comprise a Shallow Trench Isolation (STI) region. The STI region may comprise Silicon Dioxide (SiO$_2$).

With continuing reference to FIG. 1, the third region 106 for capturing ultraviolet light comprises a third substrate 148, a second hard mask layer 150 comprising a plurality of trenches on the third substrate 148, a second trench fill material 152 in the plurality of trenches of the second hard mask layer 150, a fifth doped region 154 on the second hard mask layer 150, a third undoped region 156 on the fifth doped region 154, and a sixth doped region 158 on the third undoped region 156. As an example, the third substrate 148 may comprise Si or other substrate materials, such as sapphire. The second hard mask layer 150 may comprise SiN or HfO$_2$. The second trench fill material 152 may comprise undoped Gallium Nitride (GaN), Aluminum Gallium Nitride (AlGaN), Indium Gallium Nitride (InGaN), or Zinc Oxide (ZnO). The fifth doped region 154 may comprise P+ doped GaN, P+ doped AlGaN, P+ doped InGaN, or P+ doped ZnO. The third undoped region 156 may comprise undoped GaN, undoped AlGaN, undoped InGaN, or undoped ZnO. The sixth doped region 158 may comprise N+ doped GaN, N+ doped AlGaN, N+ doped InGaN, or N+ doped ZnO. The fifth doped region 154, the third undoped region 156, and the sixth doped region 158 form a third photo diode for capturing ultraviolet light. The third region 106 also comprises a fifth contact 160 on the fifth doped region 154 and a sixth contact 162 on the sixth doped region 158. As an example, the fifth contact 160 may comprise Au/Ni or Au/Pt and the sixth contact 162 may comprise Au/Ni, Ti/Au, or Ti/Aluminum (Al). The fifth contact 160 forms ohmic contact with the fifth doped region 154 and the sixth contact 162 forms ohmic contact with the sixth doped region 158. The third region 106 further comprises a third color filter layer 164 and third on chip lenses 166. As an example, the third color filter layer 164 may comprise color filters for ultraviolet light. The third on chip lenses 166 may comprise lenses for ultraviolet light. The second region 104 and the third region 106 are separated by a second isolation region 146. As an example, the second isolation region 146 may comprise an STI region. The STI region may comprise SiO$_2$.

With continuing reference to FIG. 1, the photo detector 100 is capable of capturing infrared light and ultraviolet light in addition to visible light. Thus, it is possible to capture visible light, infrared light, and ultraviolet light in a same picture using the photo detector 100 in a camera. Additionally, a camera based on the photo detector 100 can be used to capture visible light, infrared light, and ultraviolet light. As such, a single camera can be used on a smartphone to take pictures using all these lights.

Figure 2A:
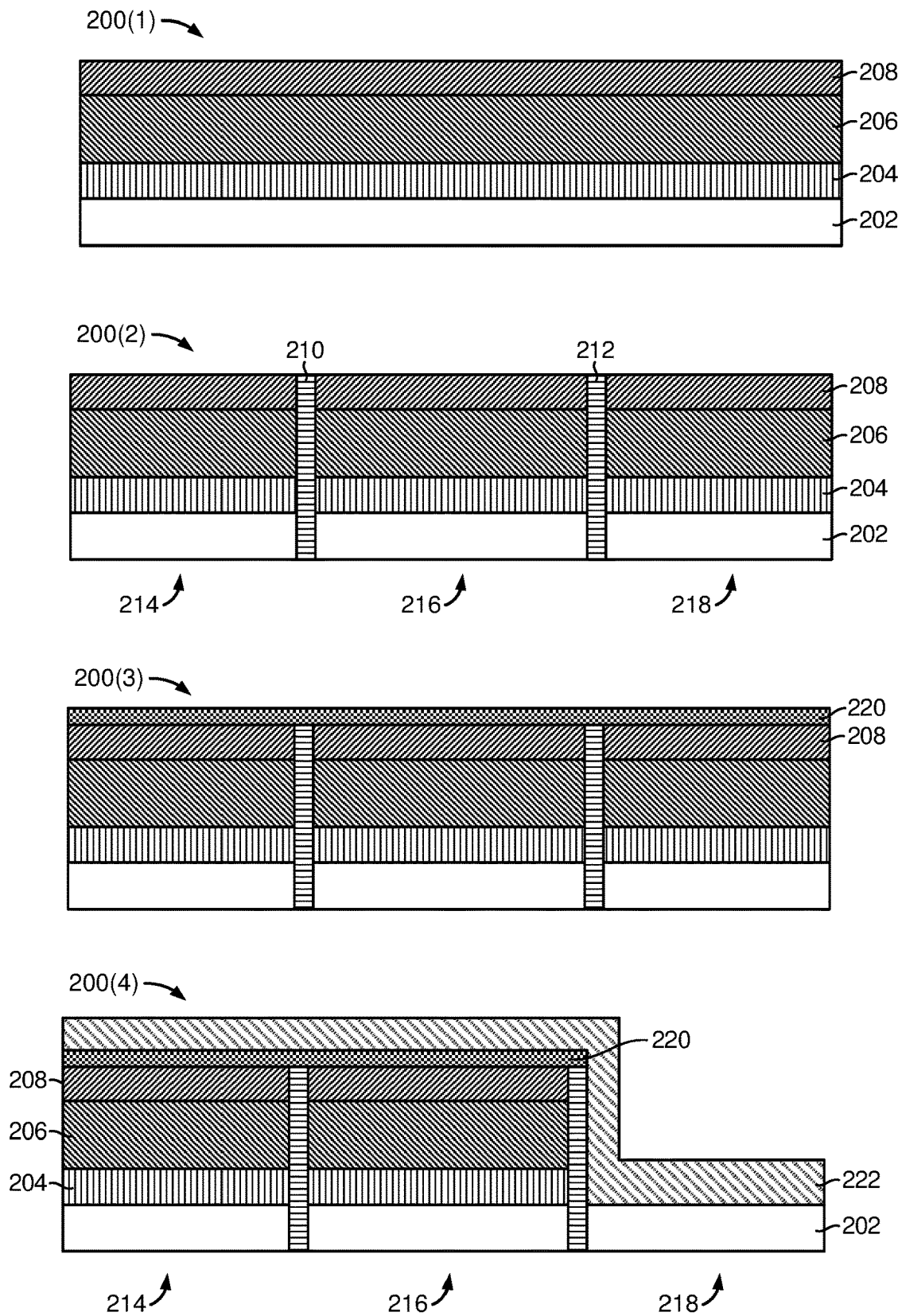
FIGS. 2A-2D illustrate an exemplary fabrication process for the exemplary photo detector of FIG. 1 in accordance with certain aspects of the present disclosure.

FIGS. 2A-2D illustrate an exemplary fabrication process for the photo detector 100 in FIG. 1 in accordance with certain aspects of the present disclosure. In FIG. 2A, stage 200(1) includes forming a first doped layer 204 on a substrate 202. As an example, the substrate 202 may comprise Si or other substrate materials, such as sapphire. The first doped layer 204 may comprise P+ doped Si with a thickness of about 0.2 micron (μm) to about 0.5 μm. The first doped layer 204 may comprise Boron (B) doped Si. The stage 200(1) also includes forming a first undoped layer 206 on the first doped layer 204. As an example, the first undoped layer 206 may comprise undoped Si with a thickness of about 2 μm to about 10 μm. The stage 200(1) further includes forming a second doped layer 208 on the first undoped layer 206. As an example, the second doped layer 208 may comprise N+ doped Si with a thickness of about 0.2 μm to about 0.5 μm. The second doped layer 208 may comprise Arsenic (As) or Phosphorus (P) doped Si.

With continuing reference to FIG. 2A, stage 200(2) includes forming STI regions 210 and 212 through the substrate 202, the first doped layer 204, the first undoped layer 206, and the second doped layer 208 to form three regions 214, 216, and 218 separated by the STI regions 210 and 212. As an example, the STI regions 210 and 212 may comprise SiO$_2$. The three regions 214, 216, and 218 may be used to form photo diodes for visible light, infrared light, and ultraviolet light, respectively.

With continuing reference to FIG. 2A, stage 200(3) includes forming a first hard mask layer 220 on the second doped layer 208. As an example, the first hard mask layer 220 may comprise Aluminum Oxide ($Al_2O_3$) with a thickness of about 10 nm to about 50 nm.

With continuing reference to FIG. 2A, stage 200(4) includes patterning the first hard mask layer 220 and removing the first doped layer 204, the first undoped layer 206, and the second doped layer 208 in region 218. The stage 200(4) further includes forming a second hard mask layer 222 on the first hard mask layer 220 in regions 214 and 216 and on the substrate 202 in region 218. As an example, the second hard mask 222 layer may comprise SiN or $HfO_2$ with a thickness of about 200 nm to about 500 nm.

Figure 2B:
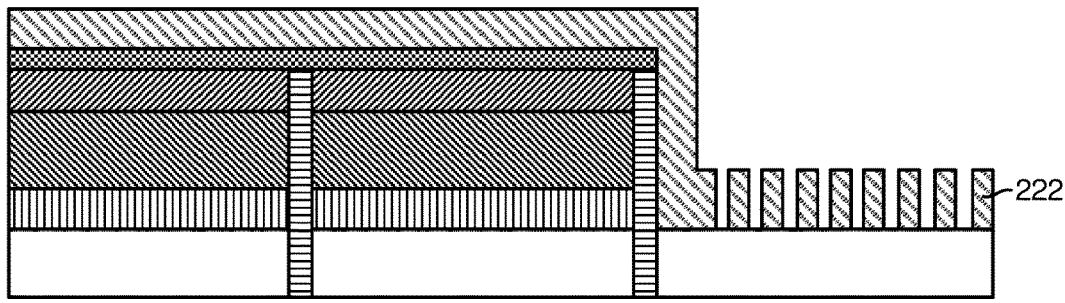
Figure 2B:
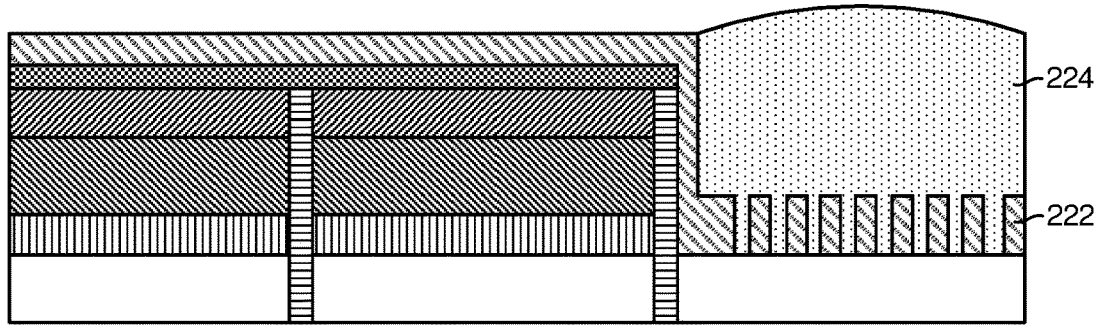
Figure 2B:
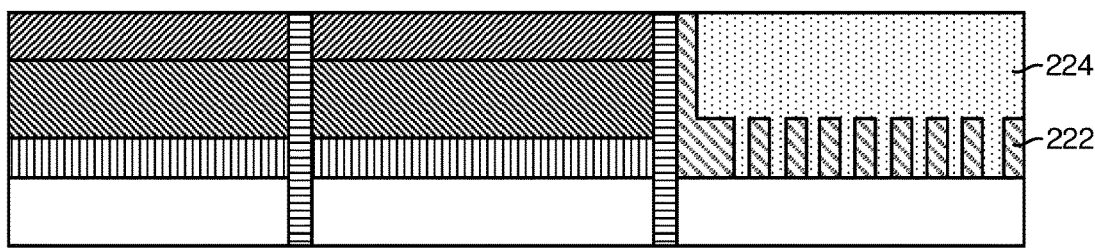
Figure 2B:
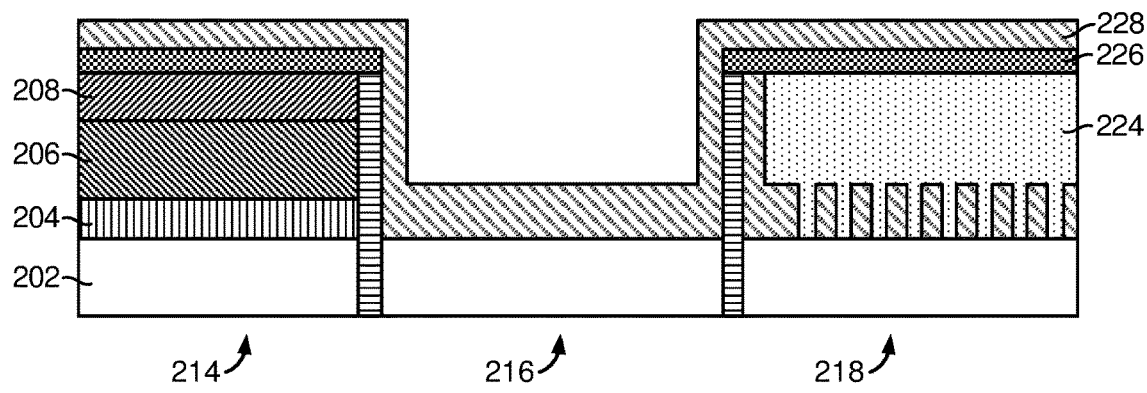

In FIG. 2B, stage 200(5) includes patterning the second hard mask layer 222 in region 218 to form a plurality of trenches. As an example, each trench in the plurality of trenches has an aspect ratio (height divided by width) of at least 5.

With continuing reference to FIG. 2B, stage 200(6) includes forming a first semiconductor material 224 in the plurality of trenches and on the second hard mask layer 222 in region 218. As an example, the first semiconductor material 224 may comprise GaN. The first semiconductor material 224 may be formed by epitaxy growth. When the first semiconductor material 224 is formed by epitaxy growth, defects in the first semiconductor material 224 may be trapped in the plurality of trenches based on the aspect ratio of each trench in the plurality of trenches. That is, the defects in the first semiconductor material 224 may not propagate to top surfaces of the plurality of trenches. Thus, the first semiconductor material 224 that forms above the plurality of trenches may possess high quality with few defects. The high quality first semiconductor material 224 above the plurality of trenches can be used to form photo diode.

With continuing reference to FIG. 2B, stage 200(7) includes Chemical Mechanical Polishing (CMP) the first semiconductor material 224 and the second hard mask layer 222, and removing the first hard mask layer 220. As an example, the CMP removes the second hard mask layer 222 and a portion of the first semiconductor material 224 and stops at the first hard mask layer 220. Next, the first hard mask layer 220 may be removed by wet etching.

With continuing reference to FIG. 2B, stage 200(8) includes forming a third hard mask layer 226 on the second doped layer 208 in regions 214 and 216 and on the first semiconductor material 224 in region 218. As an example, the third hard mask layer 226 may comprise $Al_2O_3$ with a thickness of about 10 nm to about 50 nm. The stage 200(8) also includes patterning the third hard mask layer 226 and removing the first doped layer 204, the first undoped layer 206, and the second doped layer 208 in region 216. The stage 200(8) further includes forming a fourth hard mask layer 228 on the third hard mask layer 226 in region 214, on the substrate 202 in region 216, and on the third hard mask layer 226 in region 218. As an example, the fourth hard mask layer 228 may comprise SiN or $HfO_2$ with a thickness of about 200 nm to about 500 nm.

Figure 2C:
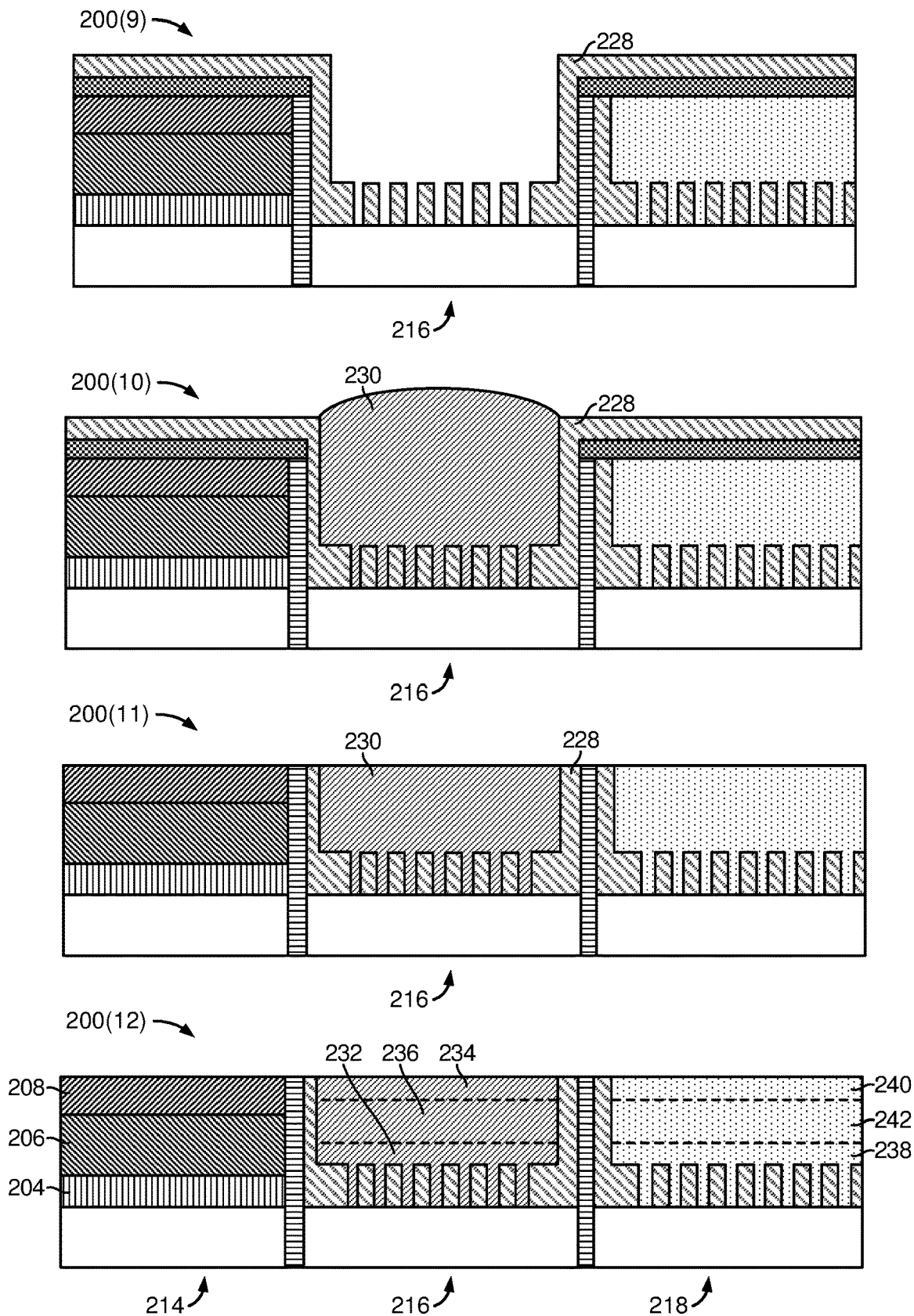

In FIG. 2C, stage 200(9) includes patterning the fourth hard mask layer 228 in region 216 to form a plurality of trenches. As an example, each trench in the plurality of trenches has an aspect ratio (height divided by width) of at least 5.

With continuing reference to FIG. 2C, stage 200(10) includes forming a second semiconductor material 230 in the plurality of trenches and on the fourth hard mask layer 228 in region 216. As an example, the second semiconductor material 230 may comprise InGaAs. The second semiconductor material 230 may be formed by epitaxy growth. When the second semiconductor material 230 is formed by epitaxy growth, defects in the second semiconductor material 230 may be trapped in the plurality of trenches based on the aspect ratio of each trench in the plurality of trenches. That is, the defects in the second semiconductor material 230 may not propagate to top surfaces of the plurality of trenches. Thus, the second semiconductor material 230 that forms above the plurality of trenches may possess high quality with few defects. The high quality second semiconductor material 230 above the plurality of trenches can be used to form photo diode.

With continuing reference to FIG. 2C, stage 200(11) includes CMP the second semiconductor material 230 and the fourth hard mask layer 228, and removing the third hard mask layer 226. As an example, the CMP removes the fourth hard mask layer 228 and a portion of the second semiconductor material 230 and stops at the third hard mask layer 226. Next, the third hard mask layer 226 may be removed by wet etching.

With continuing reference to FIG. 2C, stage 200(12) illustrates in region 214, there are the first doped layer 204, the second doped layer 208, and the first undoped layer 206 between the first doped layer 204 and the second doped layer 208. As mentioned above, the first doped layer 204 may comprise P+ doped Si. The second doped layer 208 may comprise N+ doped Si. The first undoped layer 206 may comprise undoped Si. The first doped layer 204, the second doped layer 208, and the first undoped layer 206 in region 214 form a first photo diode for capturing visible light. The stage 200(12) also illustrates the second semiconductor material 230 in region 216 comprises a third doped layer 232, a fourth doped layer 234, and a second undoped layer 236 between the third doped layer 232 and the fourth doped layer 234. As an example, the third doped layer 232 may comprise P+ doped InGaAs. The fourth doped layer 234 may comprise N+ doped InGaAs. The second undoped layer 236 may comprise undoped InGaAs. The third doped layer 232, the fourth doped layer 234, and the second undoped layer 236 in region 216 form a second photo diode for capturing infrared light. The third doped layer 232 may be formed by epitaxy growth. The fourth doped layer 234 may be formed by epitaxy growth. The second undoped layer 236 may be formed by epitaxy growth. The second semiconductor material 230 in the plurality of trenches in region 216 may comprise undoped InGaAs. The stage 200(12) further illustrates the first semiconductor material 224 in region 218 comprises a fifth doped layer 238, a sixth doped layer 240, and a third undoped layer 242 between the fifth doped layer 238 and the sixth doped layer 240. As an example, the fifth doped layer 238 may comprise P+ doped GaN. The sixth doped layer 240 may comprise N+ doped GaN. The third undoped layer 242 may comprise undoped GaN. The fifth doped layer 238, the sixth doped layer 240, and the third undoped layer 242 in region 218 form a third photo diode for capturing ultraviolet light. The fifth doped layer 238 may be formed by epitaxy growth. The sixth doped region 240 may be formed by epitaxy growth. The third undoped layer 242 may be formed by epitaxy growth. The first semiconductor material 224 in the plurality of trenches in region 218 may comprise undoped GaN. The first photo diode for capturing visible light in region 214, the second photo diode for capturing infrared light in region 216, and the third photo diode for capturing ultraviolet light in region 218 form a photo detector capable of capturing infrared light and ultraviolet light in addition to visible light.

Figure 2D:
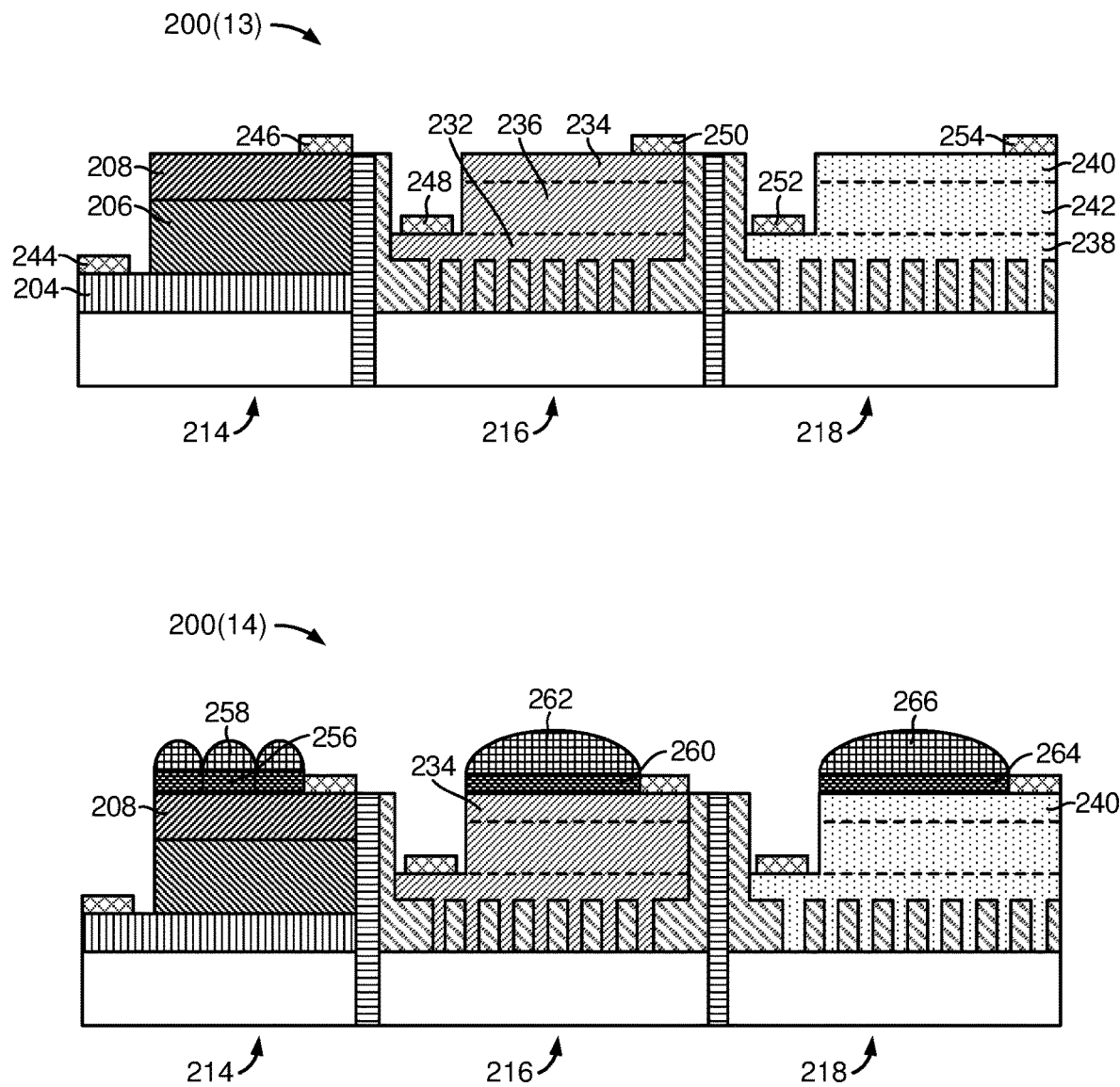

In FIG. 2D, stage 200(13) includes in region 214, patterning the second doped layer 208 and the first undoped layer 206, forming a first contact 244 on the first doped layer 204, and forming a second contact 246 on the second doped layer 208. As an example, the first contact 244 may comprise Ti/Ni/Pt and the second contact 246 may comprise Ti/Ni/Pt. The first contact 244 forms ohmic contact with the first doped layer 204 and the second contact 246 forms ohmic contact with the second doped layer 208. The stage 200(13) also includes in region 216, patterning the fourth doped layer 234 and the second undoped layer 236, forming a third contact 248 on the third doped layer 232, and forming a fourth contact 250 on the fourth doped region 234. As an example, the third contact 248 may comprise Ti/Pt and the fourth contact 250 may comprise Ti/Pt or Au/Ge. The third contact 248 forms ohmic contact with the third doped layer 232 and the fourth contact 250 forms ohmic contact with the fourth doped layer 234. The stage 200(13) further includes in region 218, patterning the sixth doped layer 240 and the third undoped layer 242, forming a fifth contact 252 on the fifth doped layer 238, and forming a sixth contact 254 on the sixth doped layer 240. As an example, the fifth contact 252 may comprise Au/Ni or Au/Pt and the sixth contact 254 may comprise Au/Ni, Ti/Au, or Ti/Al. The fifth contact 252 forms ohmic contact with the fifth doped layer 238 and the sixth contact 254 forms ohmic contact with the sixth doped layer 240.

With continuing reference to FIG. 2D, stage 200(14) includes in region 214, forming a first color filter layer 256 on the second doped layer 208 and forming first on chip lenses 258 on the first color filter layer 256. As an example, the first color filter layer 256 may comprise color filters for red, blue, and green light, respectively. The first on chip lenses 258 may comprise lenses for red, blue, and green light, respectively. The stage 200(14) also includes in region 216, forming a second color filter layer 260 on the fourth doped layer 234 and forming second on chip lenses 262 on the second color filter layer 260. As an example, the second color filter layer 260 may comprise color filters for infrared light. The second on chip lenses 262 may comprise lenses for infrared light. The stage 200(14) further includes in region 218, forming a third color filter layer 264 on the sixth doped layer 240 and forming third on chip lenses 266 on the third color filter layer 264. As an example, the third color filter layer 264 may comprise color filters for ultraviolet light. The third on chip lenses 266 may comprise lenses for ultraviolet light. As mentioned above, the photo detector comprising the photo diodes in regions 214, 216, and 218 is capable of capturing infrared light and ultraviolet light in addition to visible light.

The elements described herein are sometimes referred to as means for performing particular functions. In this regard, the first photo diode comprising the first doped region 110, the first undoped region 112, and the second doped region 114 is sometimes referred to herein as "means for capturing visible light." The second photo diode comprising the third doped region 130, the second undoped region 132, and the fourth doped region 134 is sometimes referred to herein as "means for capturing infrared light." The third photo diode comprising the fifth doped region 154, the third undoped region 156, and the sixth doped region 158 is sometimes referred to herein as "means for capturing ultraviolet light." According to a further aspect of the present disclosure, the aforementioned means may be any layer, module, or any apparatus configured to perform the functions recited by the aforementioned means.

The photo detector capable of capturing infrared light and ultraviolet light in addition to visible light according to certain aspects disclosed herein may be provided in or integrated into any electronic device. Examples, without limitation, include a set top box, an entertainment unit, a navigation device, a communication device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, and a drone.

Figure 3:
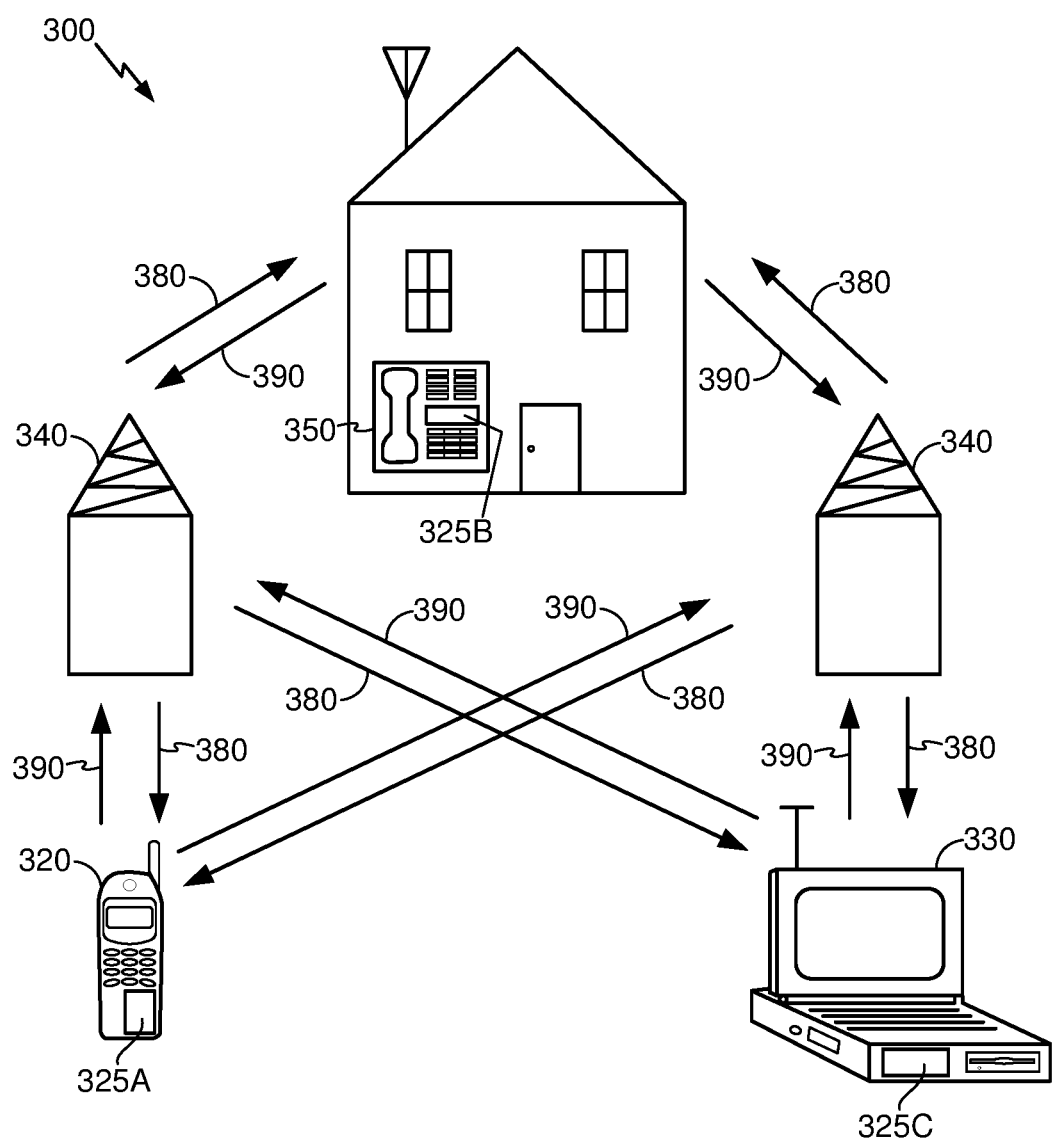
FIG. 3 is a block diagram showing an exemplary wireless communication system in which an aspect of the present disclosure may be employed.

In this regard, FIG. 3 is a block diagram showing an exemplary wireless communication system 300 in which an aspect of the present disclosure may be employed. For purposes of illustration, FIG. 3 shows three remote units 320, 330, and 350 and two base stations 340. It will be recognized that wireless communication systems may have many more remote units and base stations. Remote units 320, 330, and 350 include integrated circuit (IC) devices 325A, 325C, and 325B that may include the disclosed photo detector. It will be recognized that other devices may also include the disclosed photo detector, such as the base stations, switching devices, and network equipment. FIG. 3 shows forward link signals 380 from the base stations 340 to the remote units 320, 330, and 350 and reverse link signals 390 from the remote units 320, 330, and 350 to the base stations 340.

In FIG. 3, remote unit 320 is shown as a mobile telephone, remote unit 330 is shown as a portable computer, and remote unit 350 is shown as a fixed location remote unit in a wireless local loop system. For example, a remote unit may be a mobile phone, a hand-held personal communication systems (PCS) unit, a portable data unit such as a PDA, a GPS enabled device, a navigation device, a set top box, a music player, a video player, an entertainment unit, a fixed location data unit, such as a meter reading equipment, or other communication device that stores or retrieves data or computer instructions, or combinations thereof. Although FIG. 3 illustrates remote units according to the certain aspects of the present disclosure, the disclosure is not limited to these exemplary illustrated units. Certain aspects of the present disclosure may be suitably employed in many devices, which include the disclosed photo detector.

Those of skill in the art will further appreciate that the various illustrative logical blocks, modules, circuits, and algorithms described in connection with the certain aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in any flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and features disclosed herein.

What is claimed is:

1. A photo detector, comprising:
   a first photo diode configured to capture visible light;
   a second photo diode configured to capture infrared light;
   a third photo diode configured to capture ultraviolet light;
   a first isolation region between the first photo diode and the second photo diode; and
   a second isolation region between the second photo diode and the third photo diode.

2. The photo detector of claim 1, wherein the second photo diode comprises at least one of Indium Gallium Arsenide (InGaAs) and Mercury Cadmium Telluride (HgCdTe).

3. The photo detector of claim 1, wherein the third photo diode comprises at least one of Gallium Nitride (GaN), Aluminum Gallium Nitride (AlGaN), Indium Gallium Nitride (InGaN), and Zinc Oxide (ZnO).

4. The photo detector of claim 1, wherein the first isolation region and the second isolation region comprise Shallow Trench Isolation (STI) regions.

5. The photo detector of claim 1, wherein the first photo diode comprises Silicon (Si).

6. The photo detector of claim 1, wherein the first photo diode comprises a first substrate, a first doped region on the first substrate, a first undoped region on the first doped region, and a second doped region on the first undoped region.

7. The photo detector of claim 6, wherein the first doped region comprises a P+ doped region and the second doped region comprises an N+ doped region.

8. The photo detector of claim 1, wherein the second photo diode comprises a second substrate, a first hard mask layer comprising a plurality of trenches on the second substrate, a third doped region on the first hard mask layer, a second undoped region on the third doped region, and a fourth doped region on the second undoped region.

9. The photo detector of claim 8, wherein the first hard mask layer comprises at least one of Silicon Nitride (SiN) and Hafnium Oxide ($HfO_2$).

10. The photo detector of claim 8, wherein the plurality of trenches of the first hard mask layer comprises a same material as the second undoped region.

11. The photo detector of claim 8, wherein each trench in the plurality of trenches of the first hard mask layer has an aspect ratio of at least 5.

12. The photo detector of claim 8, wherein the third doped region comprises a P+ doped region and the fourth doped region comprises an N+ doped region.

13. The photo detector of claim 1, wherein the third photo diode comprises a third substrate, a second hard mask layer comprising a plurality of trenches on the third substrate, a fifth doped region on the second hard mask layer, a third undoped region on the fifth doped region, and a sixth doped region on the third undoped region.

14. The photo detector of claim 13, wherein the second hard mask layer comprises at least one of SiN and $HfO_2$.

15. The photo detector of claim 13, wherein the plurality of trenches of the second hard mask layer comprises a same material as the third undoped region.

16. The photo detector of claim 13, wherein the fifth doped region comprises a P+ doped region and the sixth doped region comprises an N+ doped region.

17. A method for fabricating a photo detector, comprising:
    forming a plurality of layers on a substrate;
    forming a first photo diode for capturing visible light on the substrate; and
    forming a second photo diode for capturing one of infrared light or ultraviolet light on the substrate, wherein the first photo diode is separated from the second photo diode by a first isolation region.

18. The method of claim 17, further comprising forming a third photo diode for capturing one of infrared light or ultraviolet light on the substrate, wherein the second photo diode is separated from the third photo diode by a second isolation region.

19. The method of claim 17, wherein the plurality of layers comprises a first doped layer on the substrate, a first undoped layer on the first doped layer, and a second doped layer on the first undoped layer.

20. The method of claim 18, wherein the first isolation region and the second isolation region comprise Shallow Trench Isolation (STI) regions.

21. The method of claim 18, wherein the second photo diode is for capturing infrared light and the third photo diode is for capturing ultraviolet light.

22. The method of claim 21, wherein the first photo diode comprises Silicon (Si), the second photo diode comprises at least one of Indium Gallium Arsenide (InGaAs) and Mercury Cadmium Telluride (HgCdTe), and the third photo diode comprises at least one of Gallium Nitride (GaN), Aluminum Gallium Nitride (AlGaN), Indium Gallium Nitride (InGaN), and Zinc Oxide (ZnO).

23. The method of claim 17, wherein forming the second photo diode for capturing one of infrared light or ultraviolet light on the substrate comprises:
- removing the plurality of layers;
- forming a hard mask layer;
- forming a plurality of trenches in the hard mask layer; and
- forming a semiconductor material in the plurality of trenches and on the hard mask layer.

24. The method of claim 23, wherein the semiconductor material is formed by epitaxy growth.

25. The method of claim 23, wherein the semiconductor material comprises a third doped layer, a fourth doped layer, and a second undoped layer between the third doped layer and the fourth doped layer.

26. The method of claim 25, wherein the third doped layer comprises a P+ doped layer and the fourth doped layer comprises an N+ doped layer.

27. The method of claim 23, wherein the hard mask layer comprises at least one of Silicon Nitride (SiN) and Hafnium Oxide ($HfO_2$).

28. The method of claim 23, wherein each trench in the plurality of trenches has an aspect ratio of at least 5.

\* \* \* \* \*